United States Patent
Dastidar et al.

(10) Patent No.: US 7,024,327 B1
(45) Date of Patent: Apr. 4, 2006

(54) TECHNIQUES FOR AUTOMATICALLY GENERATING TESTS FOR PROGRAMMABLE CIRCUITS

(75) Inventors: Jayabrata Ghosh Dastidar, Santa Clara, CA (US); Adam Wright, Santa Clara, CA (US); Hung Hing Anthony Pang, San Jose, CA (US); Binh Vo, San Jose, CA (US); Ajay Nagarandal, Sunnyvale, CA (US); Paul J. Tracy, Sunnyvale, CA (US); Michael Harms, Pleasanton, CA (US)

(73) Assignee: Altera Corporation, San Jose, CA (US)

( * ) Notice: Subject to any disclaimer, the term of this patent is extended or adjusted under 35 U.S.C. 154(b) by 9 days.

(21) Appl. No.: 10/323,506

(22) Filed: Dec. 18, 2002

(51) Int. Cl.
*G01R 31/00* (2006.01)
*G01R 31/14* (2006.01)

(52) U.S. Cl. .................................................... 702/117

(58) Field of Classification Search ........ 702/117–120, 702/123; 716/17–19
See application file for complete search history.

(56) References Cited

U.S. PATENT DOCUMENTS

| | | | |
|---|---|---|---|
| 4,899,067 A | 2/1990 | So et al. | |
| 5,369,314 A | 11/1994 | Patel et al. | |
| 5,434,514 A | 7/1995 | Cliff et al. | |
| 5,592,102 A | 1/1997 | Lane et al. | |
| 5,633,813 A * | 5/1997 | Srinivasan | 703/14 |
| 5,790,479 A | 8/1998 | Conn | |
| 5,909,450 A * | 6/1999 | Wright | 714/724 |
| 5,991,898 A | 11/1999 | Rajski et al. | |
| 6,034,536 A | 3/2000 | McClintock et al. | |
| 6,107,820 A | 8/2000 | Jefferson et al. | |
| 6,112,020 A * | 8/2000 | Wright | 716/17 |
| 6,201,404 B1 | 3/2001 | Reddy et al. | |
| 6,233,205 B1 | 5/2001 | Wells et al. | |
| 2002/0003742 A1 | 1/2002 | Nguyen et al. | |
| 2003/0072185 A1 | 4/2003 | Lane et al. | |

OTHER PUBLICATIONS

Xilinx "Virtex-II Platform FPGAs: Detailed Description, Advance Product Specification," DS031-2 (v2.1.1) Dec. 6, 2002.
Xilinx "Virtex-II Platform FPGAs: Introduction and Overview, Advance Product Specification," DS031-1 (v1.9) Sep. 26, 2002; Xilinx "Virtex-II EasyPath FAQs" 4 pages total.

* cited by examiner

*Primary Examiner*—Michael Nghiem
(74) *Attorney, Agent, or Firm*—Townsend and Townsend and Crew, LLP

(57) ABSTRACT

Programmable circuits have a programmable interconnect structure that connects programmable circuit elements. Tests patterns can be automatically generated for the programmable circuit elements and interconnections on a programmable circuit. A connectivity graph represents programmable interconnections and functions as nodes. Tests routes are generated that connect the nodes in the connectivity graph between control points and observation points on the programmable circuit. The routes are grouped into configuration patterns that can be tested in one test cycle. Test vectors are then applied to the routes to determine if the interconnects and circuit functions are operable. Systems and methods of the present invention automatically create test patterns for a programmable circuit to reduce engineer time. The present invention also reduces test time and resources by increasing the number of interconnections and circuit elements tested in each configuration pattern.

14 Claims, 4 Drawing Sheets

TECHNIQUES FOR AUTOMATICALLY GENERATING TESTS FOR PROGRAMMABLE CIRCUITS

BACKGROUND OF THE INVENTION

The present invention relates to techniques for testing programmable circuits, and more particularly, to techniques for automatically generating tests for programmable circuit using a connectivity graph.

Programmable logic circuits (PLDs) include logic elements, memory, and conductors that are programmably connected in an interconnect structure. The logic elements and the connections to the conductors can be programmed according a number of different designs.

After a PLD is manufactured, the logic elements, memory, and programmable connections in the interconnect structure are tested to ensure that they are operating properly. Tests are performed to detect the presence of any manufacturing detects in the programmable logic device (PLD).

It would be desirable to provide techniques for testing programmable circuits that reduce the time spent by engineers to perform the tests.

BRIEF SUMMARY OF THE INVENTION

The present invention provides techniques for automatically generating test patterns for programmable integrated circuits. Programmable integrated circuits have a programmable interconnect structure that connects programmable logic elements, memory, and other circuits.

A connectivity graph represents the interconnections on a programmable integrated circuit as nodes. A router automatically generates tests routes that connect the nodes in the connectivity graph between control points and observation points on the programmable integrated circuit. The routes are grouped into configuration patterns that can be tested in one test cycle. Test vectors are then applied to the routes to determine if interconnections and functions on the programmable circuit are operable.

Systems and methods of the present invention automatically create test patterns for a programmable integrated circuit to reduce engineer time. The present invention also reduces test time and resources by increasing the number of interconnections and other circuits that are tested in each test cycle.

DETAILED DESCRIPTION OF THE INVENTION

The present invention provides techniques for testing programmable integrated circuits. Programmable integrated circuits include programmable logic devices (PLDs), field programmable gate arrays (FPGAs), and programmable logic arrays. Although the present invention is discussed primarily in the context of PLDs, principles of the present invention apply to any type of programmable circuit.

A series of tests are performed to detect the presence of any manufacturing detects in the programmable logic device (PLD). The programmable connections in a PLD are tested to determine if they are working properly. The logic functions, memory functions, and analog functions on the PLD are also tested.

Programmable connections on a PLD can be thought of as a series of programmable multiplexers coupled together. Each multiplexer represents a programmable connection. The multiplexers are programmed at each interconnection to connect one conductor to another conductor (or one circuit to another circuit or conductor). A series of multiplexer connections can be made across the PLD from one point to another point.

RAM bit address (RBA) bits are used to program each of the multiplexer connections on the PLD. The RBA bits are stored in a RAM. A database stores a set of program bits for every possible programmable connection on a PLD.

According to one system for testing a PLD, engineers manually select a series of routes across the PLD that ideally encompass every possible connection on the PLD. The routes are used to test the programmable connections and other circuit elements.

Engineers then manually identify the multiplexer connections that make up each route. Each of the routes connects a control point to an observation point. The control and observation points are typically located at scan registers and input/output pins.

The programmable circuits are then tested using the routes. Test values are applied to the control points, and output values are read from the observation points. The output values are compared to expected values to determine if the programmable connections, logic functions, and other circuit elements are operating properly.

Figure 1:
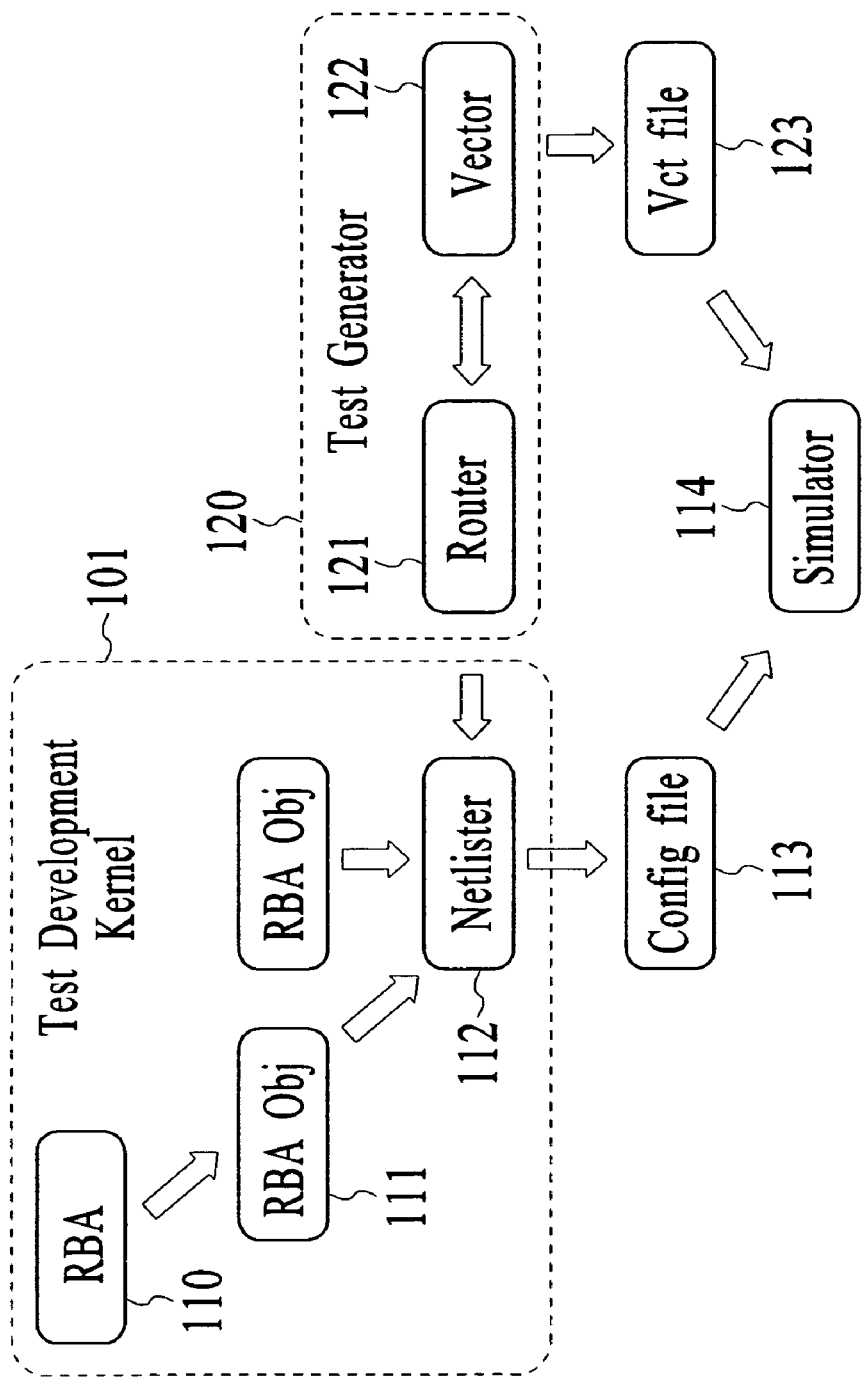
FIG. 1 is a flow chart illustrating a manual procedure for testing a programmable circuit.

FIG. 1 illustrates a test development kernel 101 for testing programmable interconnections and other functions on a PLD. The RBA bits 110 are shown in FIG. 1. The RBA bits 110 are stored in RBA object files 111. The RBA files 111 are compiled together into a "netlister" file 112.

Engineers manually select a series of routes across the PLD to test each of the programmable connections. After engineers select a route across the PLD, router 121 makes the connections. Router 121 uses RBA bits 110 to make each of the multiplexer connections in a route.

All of the RBA bits that make up a route from a control point to an observation point are stored in a configuration file 113. Each configuration file 113 includes the programmable connections and functions that make up the route. A configuration file 113 is used to program the programmable connections and other elements on the PLD in a route using RBA object files in the netlister 112.

Engineers develop numerous configuration files for a PLD. Each configuration file 113 includes a subset of the programmable connections and functions that can be tested in one test cycle. Preferably, as many connections and functions as possible are tested in each test cycle.

A configuration file 113 can include more than one route. All of the routes in one configuration file can be tested at the same time. Routes that are tested at the same time cannot include overlapping circuit elements or overlapping connections. Routes that do not include overlapping elements can be included in one configuration file and tested at the same time.

Ideally, there are enough configuration files to test every possible connection on the PLD. For example, if there is an 8 input, one output multiplexer on a PLD, there should be at least 8 different configuration files to test the connections for each of the 8 inputs. Each configuration file is used to test the connection for one of the multiplexer inputs. Eight test cycles are needed to test an 8 input multiplexer, because overlapping connections cannot be tested at the same time.

To test a PLD for defects, the programmable connections on the PLD are first connected according to the routes specified in one of the configuration files.

A series of test vectors are developed to test the PLD. FIG. 1 also illustrates a test generator 120 that generates test vectors 123 for a PLD. Each test vector 123 is created to test the operability of the programmable connections and other functions in a particular route between a control point and an observation point.

Vector generators 122 generate test values that can be used to verify the proper operation of the programmed connections on the PLD. The test values are applied to the control points. Output values are subsequently read from the observation points and compared to expected values. The test values and expected values are stored as test vectors 123.

Simulator 114 then tests a software representation of the PLD using test vector 123. Simulator 114 determines if the test vectors are accurate. Simulator 114 may be a computer program.

Once all of the connections made by a first configuration file have been tested, the programmable connections on the PLD are reconfigured according to a second configuration file. Simulator 114 then tests the programmable connections and elements in the routes connected by the second configuration file using a second set of test vectors. This process repeats until all of the programmable connections and elements on the PLD have been tested. Simulator 114 verifies the test vectors corresponding to each of the configuration files.

Once the test vectors have been verified, they can be used by a processor to test an actual programmable integrated circuit (e.g., a PLD). The PLD may be broken into segments to simply this process. Each segment has its own configuration files and test vectors. Each segment of the PLD is tested separately.

Figure 2:
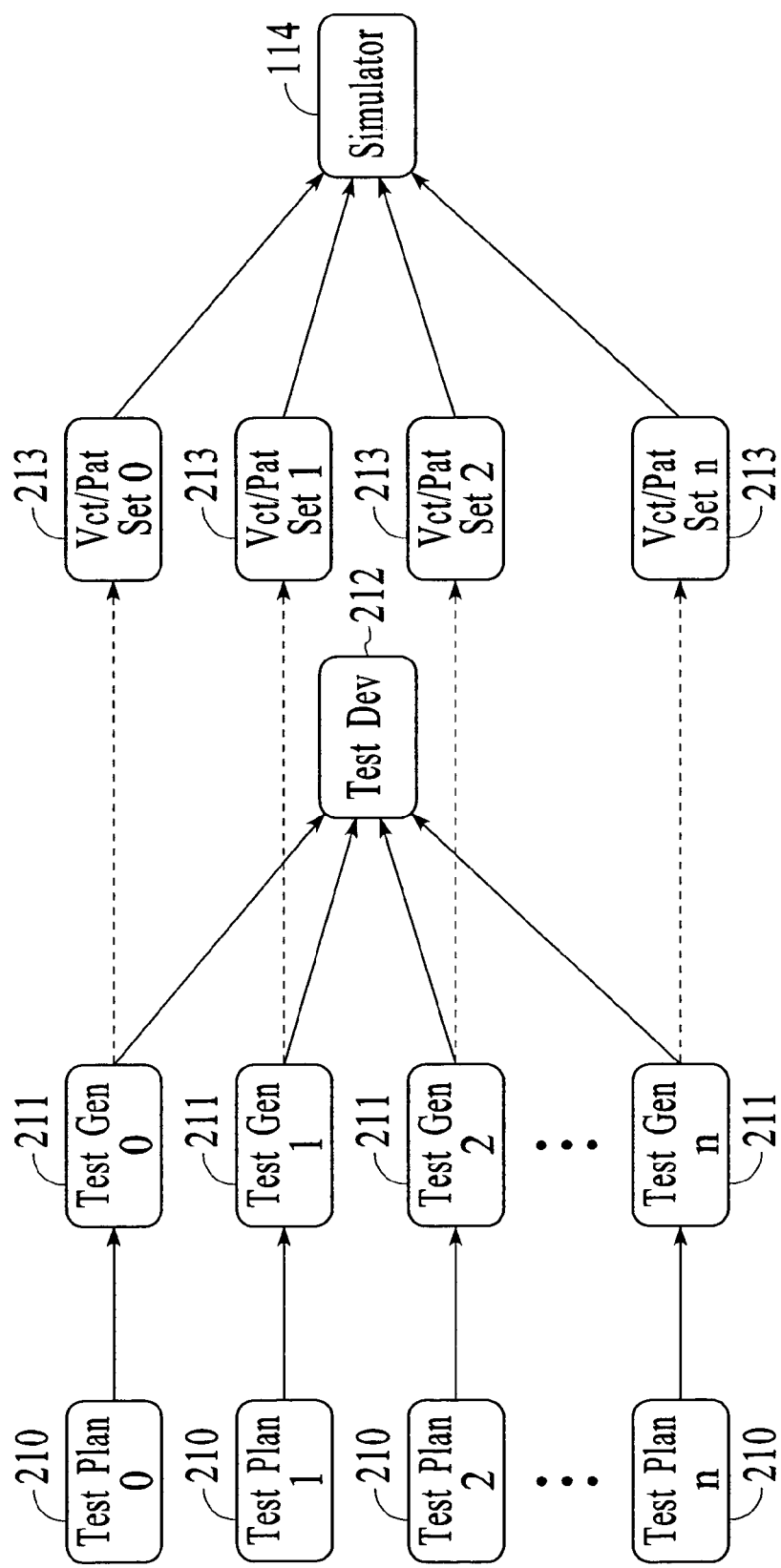
FIG. 2 is a flow chart illustrating a test plan sequence for the manual test procedure of FIG. 1.

FIG. 2 illustrates a flow chart that shows a test process for a PLD. Initially, engineers develop test plans 210 to test the programmable connections and logic elements on the PLD. The test plans 210 are used to develop the configuration files. Each configuration file can hook up a plurality of non-overlapping routes that can be simultaneously connected on the PLD and tested in one test cycle.

Test generations 211 are then developed from test plans 210. Each test generation 211 is developed by test generator 120 for one of the test plans 210. Test generations 211 include test vectors that can be used to test the programmable connections and other functions in the routes in the test plans 210.

The data developed for the test generations together represent a test development system 212 for testing many or all of the programmable circuits on a PLD. The test development system 212 can be stored and reused to test a plurality of PLDs with the same design.

The test generations 211 are used to develop test vector/pattern sets 213. Test vector/pattern sets 213 are files that can be used by simulator 114 to verify the test vectors. Test sets 213 include the test vector files 123 and the configuration files 113.

Thus, a substantial amount of engineer time is needed to create and perform tests for programmable circuits. It would therefore be desirable to provide techniques for testing programmable circuits that reduce the time spent by engineers.

Figure 3:
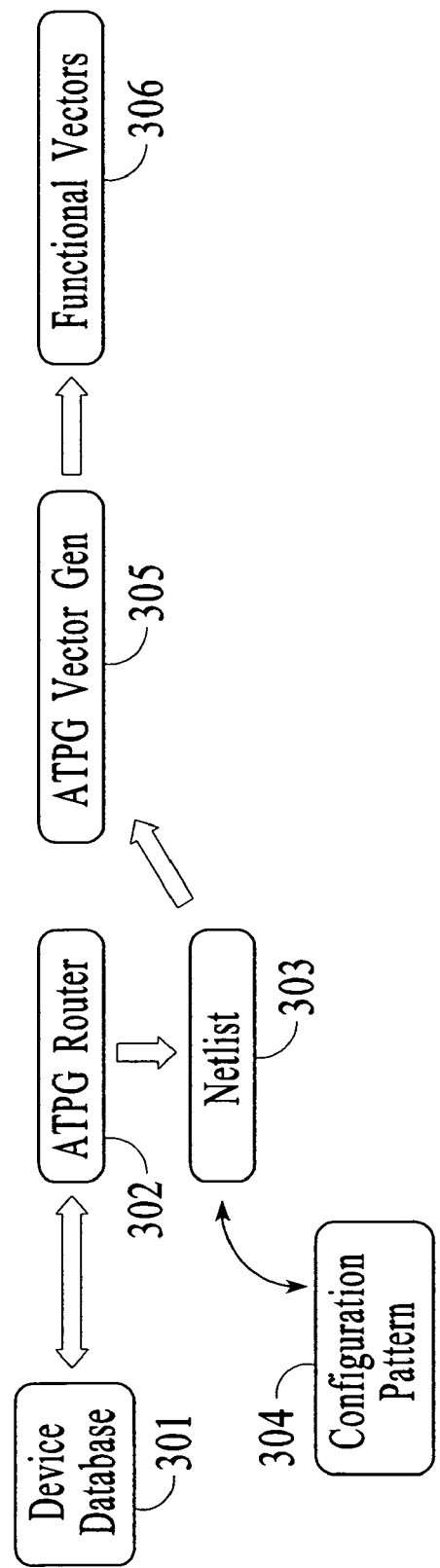
FIG. 3 is a flow chart illustrating an automatic procedure for testing a programmable circuit according to the present invention.

FIG. 3 is a graph that illustrates an embodiment of the present invention. Device database 301 stores a connectivity graph. The connectivity graph contains a map of a programmable integrated circuit. The connectivity graph is a representation of all of the programmable elements on the programmable integrated circuit. The connectivity graph can map programmable connections in the interconnect structure, programmable logic elements, and any other circuit elements.

The connectivity graph can include a representation of a hierarchical interconnection structure with global and local conductors. The connectivity graph includes representations of all of the possible programmable states of the programmable circuit elements on the programmable integrated circuit.

The connectivity graph is stored in a database 301. Each programmable circuit element is represented as a node. For example, a node may represent a programmable connection between conductors, a programmable connection between a circuit element and a conductor, a programmable logic or analog function performed by a programmable circuit element, etc.

Each node is connected to another node. The connections between nodes may be programmable. All of the information relating to the functions and interconnections on an programmable integrated circuit are stored in the connectivity graph.

The nodes in the connectivity graph are interconnected to form a geographical representation of the programmable circuit. A connection between nodes may represent a programmable connection. The connectivity graph can also include logic gates that represent logic functions performed by logic elements. The connectivity graph can also represent analog functions.

The connectivity graph is a map of the integrated circuit. The map includes representations of the programmable circuit elements and programmable connections on an integrated circuit. The connectivity graph can be used to create test patterns.

After a connectivity graph for a programmable circuit has been created and stored in a database 301, an automatic test program generator (ATPG) router 302 automatically creates a series of routes across the programmable circuit. Router 302 can use the information stored in the connectivity graph to make routes between any two points on the programmable circuit.

Each route represents a series of connections between nodes in the connectivity graph from a control point to an observation point. Usually, the control and observation points are at input/output pins of the PLD.

A route may include logic functions performed by logic elements, programmable connections between conductors, programmable connections between conductors and logic elements, programmable connections to input/output pins, analog functions, memory, and any non-programmable circuit elements. For example, a route may include a logic function such as an inversion.

Router 302 automatically creates the routes using the connectivity graph. The router creates a route by selecting a series of nodes that connect a control point to an observation point.

If the architecture of a programmable integrated circuit is similar enough, a route that lies entirely within a row of logic elements can be replicated in other rows.

For each node that is added to a current route, the router selects the fan-out for the last node added to the current route. The fan-out for a node includes all of the resources on the integrated circuit that can be directly connect to that node. The fan-out for each node on the integrated circuit is stored in the connectivity graph. Router 302 selects a node in the fan-out that has not already been connected to any route in the current test cycle. The router then connects the selected node to the last node in the current route to form the next link.

Each time router 302 adds a node to a route, the node is marked in the connectivity graph so that it cannot be reused in the same test cycle. When the router has finished forming a route, the route is stored in a netlist file 303. Each node in a completed route has been marked in the connectivity graph.

Router 302 then automatically creates another route that does not use any of the nodes that were used in the previous routes. When router 302 makes the next route, the connectivity graph prevents router 302 from using any of the nodes (i.e., resources) that were used in the previous routes.

As router 302 continues to automatically generate routes, each node in a route is marked in the connectivity graph so that it cannot be reused in a subsequent route. Thus, the connectivity graph ensures that router 302 creates routes with nodes that do not overlap. This technique prevents conflicts in the finished test pattern.

Router 302 continues to make non-overlapping routes until most or all of the nodes on the programmable integrated circuit have been used up. The routes are stored as a netlist file 303. Netlist file 303 stores a series of routes on a programmable circuit that can be used to test the circuit in one testing cycle. All of the routes grouped together in a testing cycle are connected together and tested at the same, as will be discussed in further detail below.

When creating routes, router 302 may run into a dead end. A dead end is a node in which all of its programmable fan-out connections have already been used. There is no way out of a dead end except to back out of it. When router 302 hits a dead end, it backs out of the dead end node and continues the route to an observation point along another path.

Router 302 continues to automatically generate routes until there are not enough unmarked nodes left to create any more complete routes on the programmable integrated circuit. Preferably, router 302 creates enough routes so that as many nodes as possible in the programmable circuit can be tested in each test cycle.

The routes stored in netlist 303 are used to create a configuration pattern 304. A configuration pattern 304 is used to connect together the nodes in each route in a test cycle. All of the routes in a configuration pattern are tested in one test cycle.

The configuration patterns 304 include files of RBA bits. The RBA bits are used to program the nodes on the PLD. Each configuration pattern contains RBA bits for all the routes in one test cycle. The RBA bits are stored in a database (e.g., database 301).

The RBA bits are accessed from the database and stored in the configuration patterns 304. During each test cycle, the RBA bits stored in a configuration pattern 304 are used to program the connections represented by each node in a route.

All the nodes marked in the connectivity graph as being used in the first test cycle are then cleared. Router 302 subsequently proceeds to create routes for a second test cycle, marking each node used in a route in the connectivity graph until no more routes can be made. Each set of completed routes is stored in netlist file 303 as a group that corresponds to a particular test cycle. These routes are then converted into configuration patterns 304 of RBA bits as discussed above.

ATPG vector generator 305 creates functional vectors 306 for each configuration pattern 304. The functional vectors 306 include test vectors and expected values. The test vectors comprise test values that are applied to the routes at the control points. Output values are subsequently read at the observation points. The output values are compared to the expected values to determine whether the routes are operable.

For example, a test value of 1 may be applied to the control point of a particular route in a configuration pattern. An output value of 0 is then read out at the observation point of the route. If the route includes only one inversion, then 0 is the expected value for a test value of 1. The expected value is compared to the output value to determine that the route is connected and operating properly.

Figure 4:
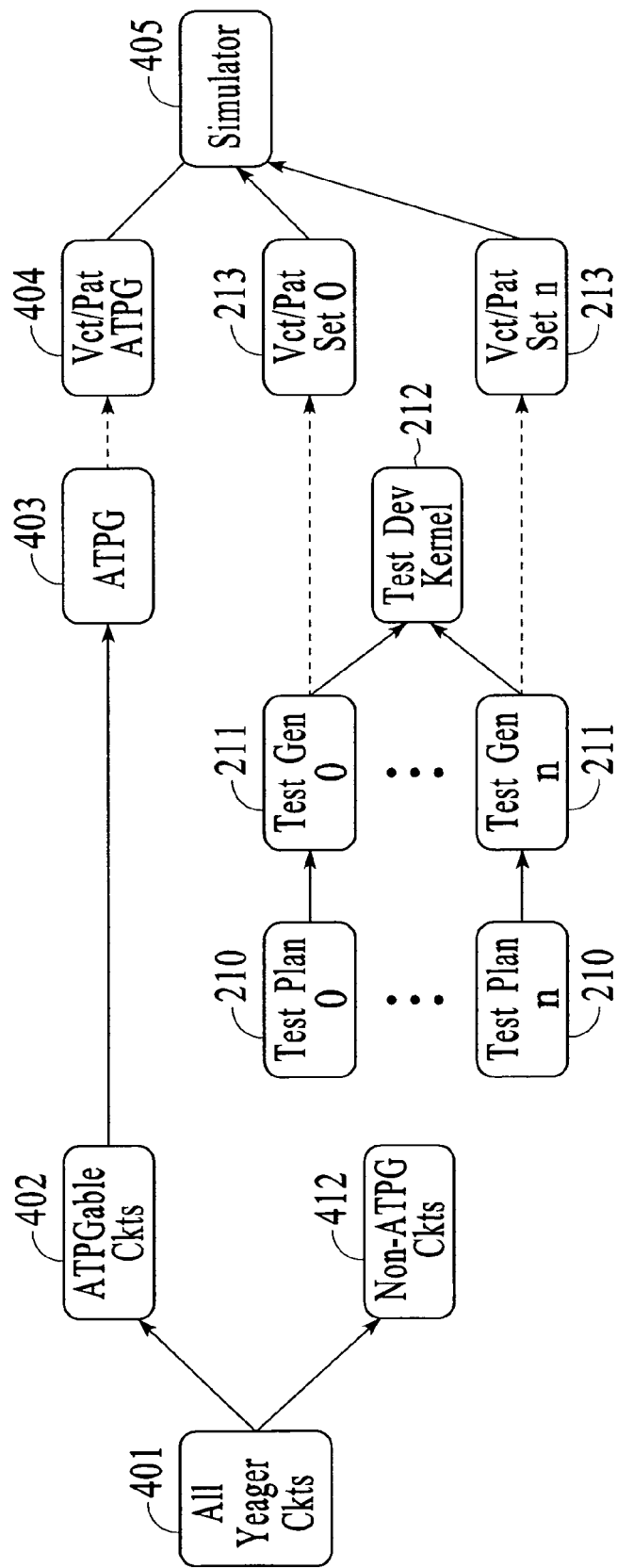
FIG. 4 is a flow chart illustrating further details of the automatic test procedure of the present invention.

FIG. 4 is a simplified flow chart that illustrates the automatic program test generator of the present invention. The first step of the test process involves dividing all of the circuit elements 401 on a programmable integrated circuit into two groups. The two groups are circuit elements 402 and circuit elements 412 as shown in FIG. 4.

Circuit elements 412 are not tested using the automatic test program techniques of the present invention. Circuit elements 412 are tested using the manual test procedures discussed above with respect to FIGS. 1–2. Circuit elements 412 may include memory and analog circuits.

Circuit elements 402 are tested using the automatic test program (ATP) techniques of the present invention. Circuit elements 402 include programmable elements such as the programmable connections to conductors and programmable logic functions. Circuit elements that are tested using the ATP techniques may include other circuit elements as well.

A system of the present invention creates an automatic test program for circuit elements 402 at step 403. The automatic test program includes configuration patterns that are generated using a connectivity graph representation of the programmable integrated circuit as discussed above. Each configuration pattern can connect a series of routes that are tested during one test cycle.

Ideally, the configuration patterns are used to test every possible programmable interconnection and logic function of circuit elements 402. However, it may not be feasible to test every possible programmable connection and logic function of circuit elements 402. But preferably most of the connections and functions of elements 402 are tested.

For example, the techniques of the present invention can generate enough configuration patterns to test 99% of the possible connections and functions of circuit elements 402.

Once the configuration patterns have been developed to test the programmable connections and functions of circuit elements 402, the vector generator 305 creates function vectors 306 at step 404 as discussed above with respect to FIG. 3. The functional vectors are tailored specifically for each of the routes in the configuration files.

Functional vectors 306 may be converted into file formats that can be read by a programmable circuit simulator 405. Simulator 405 then verifies the functional vectors 306. Simulator 405 also verifies test vectors for circuit elements 412 using manually generated configuration files 113 and test vector files 123.

Simulator 405 simulates the test patterns for circuit elements 402 and 412 on a software representation of the programmable integrated circuit. This simulation is used to test the configuration patterns and functional vectors. For example, the software representation of the programmable integrated circuit may contain no defects or imperfections. Therefore, if any of the tests fails, then it is clear that the error is being caused by one of the configuration patterns or one of the functional vectors.

After the simulator has confirmed that the configuration patterns and functional vectors are operating properly, they can be used by a tester to test an actual programmable integrated circuit. The configuration patterns and functional vectors can be reused to test multiple programmable integrated circuits that have the same design.

The configuration patterns are used to program the programmable connections on the programmable integrated circuit or the software representation of a programmable circuit. Each configuration pattern is used to program routes that are tested in one test cycle. The test vectors are then applied to observation points on the programmable circuit to test the operability of circuit elements on the programmable circuit.

In one embodiment, an embedded microprocessor that resides on the same integrated circuit as the PLD can test the PLD using the configuration patterns and functional vectors. In another embodiment, an external processor tests the PLD using the configuration patterns and functional vectors.

The automatic test program techniques of the present invention provide several important advantages. The present invention reduces engineer time spent to create configuration patterns to test a programmable integrated circuit. Thus, the present invention reduces the time it takes to generate test patterns for a programmable circuit. According to the present invention, the configuration patterns are generated automatically.

By increasing the number of programmable connections and functions tested in each test cycle, less test cycles are used to test an entire integrated circuit. Thus, the present invention reduces the time it takes to test a programmable integrated circuit.

In addition, the present invention reduces the number of mistakes that are made in the process of generating configuration patterns. By providing an automated test generation system, the number of mistakes made during a manual configuration pattern generation process is reduced by eliminating human errors.

While the present invention has been described herein with reference to particular embodiments thereof, a latitude of modification, various changes, and substitutions are intended in the present invention. In some instances, features of the invention can be employed without a corresponding use of other features, without departing from the scope of the invention as set forth. Therefore, many modifications may be made to adapt a particular configuration or method disclosed, without departing from the essential scope and spirit of the present invention. It is intended that the invention not be limited to the particular embodiment disclosed, but that the invention will include all embodiments and equivalents falling within the scope of the claims.

What is claimed is:

1. A method for generating tests for a programmable integrated circuit, the method comprising:
   accessing from a database a representation of the programmable integrated circuit that comprises nodes connected together, wherein each of the nodes represents a programmable resource on the programmable integrated circuit;
   automatically generating test patterns that each comprise routes across the programmable integrated circuit using the representation, wherein each route connects a control point to an observation point by programming a subset of the nodes; and
   for each of the test patterns, testing all of the routes in the test pattern in a single test cycle.

2. A method for generating tests for a programmable integrated circuit, the method comprising:
   accessing from a database a representation of the programmable integrated circuit that comprises nodes connected together, wherein each of the nodes represents a programmable resource on the programmable integrated circuit; and
   generating a test pattern that comprises routes across the programmable integrated circuit, each of the routes comprising a subset of the nodes, the test pattern being generated by automatically selecting each of the nodes in the routes from the representation and automatically connecting the selected nodes together to form the routes;
   wherein generating the test pattern further comprises:
   selecting each of the routes using a router;
   grouping sets of the routes together into configuration patterns; and
   selecting program bits that are used to program the nodes that connect the routes, wherein the routes in each configuration pattern are tested in a single test cycle.

3. The method of claim 2 wherein the nodes used in one of the routes are marked in the representation and not reused in another route in the same configuration pattern.

4. The method of claim 2 wherein grouping sets of the routes together into configuration patterns further comprises:
   maximizing the routes grouped into each of the configuration patterns.

5. A system for generating tests for a programmable integrated circuit, the system comprising:
   a database storing a plurality of interconnected nodes that represent programmable circuit elements on the programmable integrated circuit; and
   a router that automatically generates routes across the programmable integrated circuit, wherein each of the routes comprises a subset of the nodes coupled between a control point and an observation point, and wherein the routes are grouped into configuration patterns, each configuration pattern comprising a subset of the routes that can be tested in a single test cycle.

6. The system of claim 5 wherein each of the configuration patterns includes program bits that are used to program the programmable circuit elements in order to connect the subset of the routes from the control points to the observation points on the programmable integrated circuit.

7. The system of claim 5 wherein the nodes used in one of the routes are marked in the database and not reused in another one of the routes in the same configuration pattern.

8. A computer system that generates tests for a programmable circuit, the computer system comprising a computer program product embedded in a computer-readable medium, said computer program product comprising:
   code for providing a representation of the programmable circuit comprising interconnected nodes, wherein the nodes represent programmable circuit elements on the programmable circuit; and code for generating a test pattern that comprises routes across the programmable integrated circuit, each of the routes comprising a subset of the nodes, wherein the code for generating the test pattern uses the representation and at least one fan-out connection to determine which programmable circuit elements are available for connection to the nodes, wherein the code automatically selects each of the nodes in the routes from any of the fan-out connections that do not overlap and automatically connects the selected nodes together to form the routes.

9. The computer system according to claim 8 further comprising: code for testing the programmable circuit elements using the test pattern by applying test values to control points and reading output values from observation points.

10. The computer system according to claim 9 wherein: the code for testing the programmable circuit elements further comprises code for comparing the output values read from the observation points to expected values to determine whether the programmable circuit elements are operable.

11. The computer system according to claim 8 wherein: a first subset of the nodes represents programmable connections to conductors on the programmable circuit.

12. The computer system according to claim 11 wherein: a second subset of the nodes represents programmable logic elements on the programmable circuit.

13. A computer system that generates tests for a programmable circuit, the computer system comprising a computer program product embedded in a computer-readable medium, said computer program product comprising:
   code for providing a representation of the programmable circuit comprising interconnected nodes, wherein the nodes represent programmable circuit elements on the programmable circuit;
   code for automatically generating routes that connect together subsets of the nodes between control points and observation points on the programmable circuit; and
   code for grouping subsets of the routes into configuration files that can be connected on the programmable circuit and tested in a single test cycle.

14. The computer system according to claim 13 wherein each of the configuration files comprises program bits that are used to program the programmable circuit elements according to the routes in that configuration file.

\* \* \* \* \*